United States Patent
Shu et al.

(10) Patent No.: US 8,598,076 B2
(45) Date of Patent: Dec. 3, 2013

(54) DISPLAY DEVICE, LASER TRANSFER PRINTING METHOD AND LASER TRANSFER COLOR DONOR SHEET

(75) Inventors: Fang-An Shu, Hsinchu (TW);
Ted-Hong Shinn, Hsinchu (TW);
Yao-Chou Tsai, Hsinchu (TW);
Wen-Chung Tang, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 0 days.

(21) Appl. No.: 12/979,873

(22) Filed: Dec. 28, 2010

(65) Prior Publication Data

US 2011/0315989 A1 Dec. 29, 2011

(30) Foreign Application Priority Data

Jun. 24, 2010 (TW) .............................. 099120702 A

(51) Int. Cl.
*B41M 5/025* (2006.01)
(52) U.S. Cl.
USPC .......................................... 503/227; 430/253
(58) Field of Classification Search
USPC .......................................... 503/227; 430/253
See application file for complete search history.

(56) References Cited

U.S. PATENT DOCUMENTS

| | | | |
|---|---|---|---|
| 5,725,989 A * | 3/1998 | Chang et al. | 430/201 |
| 2005/0186366 A1 | 8/2005 | Kim et al. | |
| 2007/0146889 A1 | 6/2007 | Wang et al. | |

FOREIGN PATENT DOCUMENTS

| | | |
|---|---|---|
| CN | 1602434 | 3/2005 |
| CN | 1693946 | 11/2005 |
| CN | 101726888 | 6/2010 |
| JP | 2003177229 A * | 6/2003 |
| JP | 2005186347 | 7/2005 |
| JP | 2008276255 | 11/2008 |
| TW | 200506272 | 2/2005 |
| TW | 200624879 | 7/2006 |
| TW | 200844495 | 11/2008 |
| WO | WO 03050575 A1 * | 6/2003 |

OTHER PUBLICATIONS

Chinese Patent Office issued Office Action on Dec. 7, 2012.
Taiwan Patent Office, Office Action, Jul. 8, 2013.
China Patent Office, "Office Action", Aug. 30, 2013.

* cited by examiner

*Primary Examiner* — Gerard Higgins
(74) *Attorney, Agent, or Firm* — WPAT, PC; Justin King

(57) ABSTRACT

A display device includes a thin film transistor substrate, a display layer, a patterned color resist layer, a patterned UV block layer and a transparent protective layer. The thin film transistor substrate has a substrate and a plurality of thin film transistors. The display layer is disposed on the thin film transistor substrate. The patterned color resist layer is disposed on the display layer. The patterned UV block layer is disposed on the patterned color resist layer. The transparent protective layer is disposed on the patterned UV block layer. The present invention also provides a laser transfer printing method for fabricating the color resist layer and the patterned UV block layer.

4 Claims, 2 Drawing Sheets

DISPLAY DEVICE, LASER TRANSFER PRINTING METHOD AND LASER TRANSFER COLOR DONOR SHEET

CROSS-REFERENCE TO RELATED APPLICATION

This application claims the priority benefit of Taiwan application serial no. 099120702, filed on 24 Jun. 2010. The entirety of the above-mentioned patent application is incorporated herein by reference and made a part of this specification.

BACKGROUND

1. Technical Field

The present invention relates to a display device, and more particularly to a display device having a color resist fabricated by a laser transfer printing method.

2. Description of the Related Art

Recently, liquid crystal display devices, electrophoretic display devices and organic light emitting diode displays are widely used.

Generally, color display of the display devices can be achieved by formation of color resist. A laser transfer printing method can transfer the color resist onto a display layer. For example, if the laser transfer printing method is applied on a black and white electrophoretic display device, the color resist can be transferred onto a surface of the black and white electrophoretic display device directly. However, after the color resist is transferred by the laser transfer printing method, color of the color resist is easily to change due to elevated temperature or exposure to ambient light. As such, display quality of the display device would be affected.

What is needed, therefore, is a new display device, a new laser transfer printing method and a new laser transfer color donor sheet that can overcome the above-mentioned shortcomings.

BRIEF SUMMARY

The present invention relates to a display device, which includes a UV block layer for preventing color of a color resist from changing.

The present invention relates to a laser transfer printing method for fabricating the color resist.

The present invention also relates to a laser transfer color donor sheet, which can be used in the laser transfer printing method for fabricating the color resist.

The present invention provides a display device, which includes a thin film transistor substrate, a display layer, a patterned color resist layer, a patterned UV block layer and a transparent protective layer. The thin film transistor substrate has a substrate and a plurality of thin film transistors. The display layer is disposed on the thin film transistor substrate. The patterned color resist layer is disposed on the display layer. The patterned UV block layer is disposed on the patterned color resist layer. The transparent protective layer is disposed on the patterned UV block layer.

In an embodiment of the present invention, the patterned UV block layer includes a mixture of titanium dioxide and thermoplastic elastic resin. The thermoplastic elastic resin can include polyurethane resin or polyester resin.

The present invention provides a laser transfer printing method for fabricating the color resist, which includes the following steps. First, a laser transfer color donor sheet is provided. The laser transfer color donor sheet has a stacked structure including a donor base, a light to heat conversion layer, a UV block layer and a color resist layer formed in the above mentioned order. Next, the laser transfer color donor sheet is arranged on a display layer, and the color resist layer faces the display layer. Next, laser light is provided to irradiate the laser transfer color donor sheet, so as to make the UV block layer and the color resist layer stripped to form a patterned color resist layer and a patterned UV block layer. The patterned color resist layer and the patterned UV block layer adhere on the display layer. The patterned color resist layer is located on the display layer. The patterned UV block layer is located on the patterned color resist layer.

The present invention also provides laser transfer color donor sheet, which includes a donor base, a light to heat conversion layer, a UV block layer and a color resist layer. The light to heat conversion layer is disposed on the donor base. The UV block layer is disposed on the light to heat conversion layer. The color resist layer is disposed on the UV block layer.

In the present invention, there is the UV block layer disposed on the color resist layer. The UV block layer can block the UV from external environment, therefore the color of the color resist would not change and display color of the display device would not vary.

Other objectives, features and advantages of the present invention will be further understood from the further technological features disclosed by the embodiments of the present invention wherein there are shown and described preferred embodiments of this invention, simply by way of illustration of modes best suited to carry out the invention.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

It is to be understood that other embodiment may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted," and variations thereof herein are used broadly and encompass direct and indirect connections, couplings, and mountings.

Figure 1:
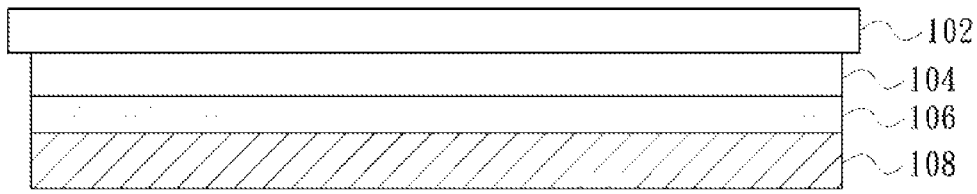
FIGS. 1 and 2 are schematic views of a color resist in some steps of a laser transfer printing method according to an embodiment of the present invention.
Figure 2:
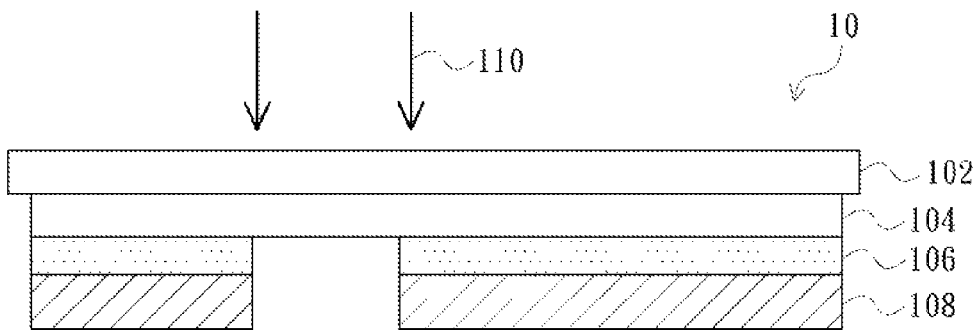
Figure 2:
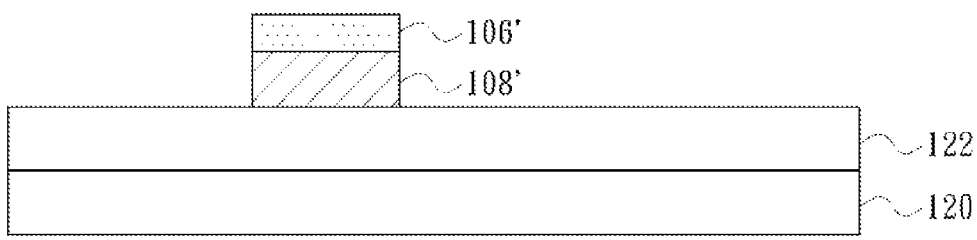

FIGS. 1 and 2 are schematic views of a color resist in some steps of a laser transfer printing method according to an embodiment of the present invention. Referring to FIG. 1, firstly, a laser transfer color donor sheet 10 is provided. The laser transfer color donor sheet 10 has a stacked structure that includes a donor base 102, a light to heat conversion layer 104, a UV block layer 106 and a color resist layer 108 formed in the above mentioned order. In details, the light to heat conversion layer 104 is disposed on the donor base 102, the UV block layer 106 is disposed on the light to heat conversion layer 104 and the color resist layer 108 is disposed on the UV block layer 106. In the embodiment, a thickness of the UV block layer 106 is 0.1~2.5 microns. In addition, in other embodiment, an adhering layer can be further formed on the color resist layer 108.

Referring to FIG. 2, the laser transfer color donor sheet 10 is arranged on a display layer 122. The display layer 122 is disposed on a thin film transistor substrate 120. The color resist layer 108 of the laser transfer color donor sheet 10 faces the display layer 122 and is in contact with the display layer 122. Next, laser light 110 is provided to irradiate a portion of the laser transfer color donor sheet 10. After the portion of the laser transfer color donor sheet 10 receives the laser light 110, light energy can be converted into heat energy by the light to heat conversion layer 104, so that the portion of the UV block layer 106 and the color resist layer 108 can be stripped from the laser transfer color donor sheet 10 to form a patterned UV block layer 106' and a patterned UV block layer 108' on the display layer 122. That is, the laser light 110 can irradiate the portion of the laser transfer color donor sheet 10 selectively, so that the desired patterns can be transferred onto the display layer 122. The patterned color resist layer 108' is located on the display layer 122, and the patterned UV block layer 106' is located on the patterned color resist layer 108'. Finally, the laser transfer color donor sheet 10 is removed from the display layer 122.

In the embodiment, the UV block layer 106 includes a mixture of titanium dioxide and thermoplastic elastic resin. The thermoplastic elastic resin includes polyurethane resin or polyester resin. A thickness of the patterned UV block layer 106' can be 0.1~2.5 microns.

Figure 3:
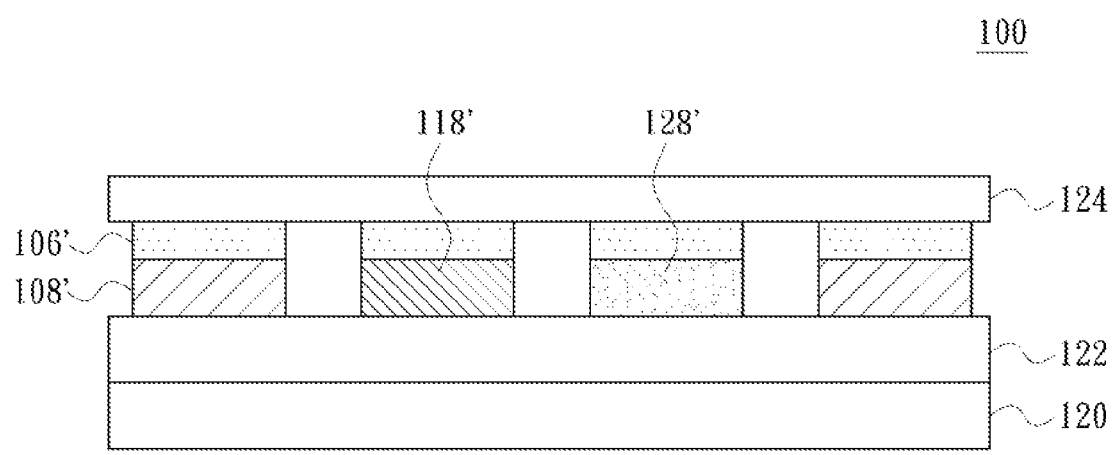
FIG. 3 is a schematic view of a display device according to an embodiment of the present invention.

Material of the color resist layer 108 can be red resist, green resist or blue resist. In the embodiment, the material of the color resist layer 108 is red resist. In addition, according to the steps shown in FIG. 2, laser transfer color donor sheets with different color resists can be provided to transfer the green resist and blue resist on the display layer orderly, so that a full color display device (as shown in FIG. 3) can be obtained. In detail, after the different color resists layer (such as the red resist layer 108', the green resist layer 118' and the blue resist layer 128') and the patterned UV block layer 106' are formed on the display layer 122 orderly, a transparent protective layer can be configured on the patterned UV block layer 106', so as to form the display device 100.

In other embodiment, the material of the color resist layer 108 of the laser transfer color donor sheet 10 can be replaced by black resist, white resist or transparent resist, so that a black matrix or a spacer can be fabricated by the laser transfer printing method.

FIG. 3 is a schematic view of a display device according to an embodiment of the present invention. Referring to FIG. 3, the display device 300 includes a thin film transistor substrate 120, a display layer 122, patterned color resist layers 108', 118', 128', a patterned UV block layer 106' and a transparent protective layer 124. The thin film transistor substrate 120 has a substrate (not labeled) and a plurality of thin film transistors (not labeled). The display layer 122 is disposed on the thin film transistor substrate 120. The patterned color resist layers 108', 118', 128' are disposed on the display layer 122. The patterned UV block layer 106' is disposed on the patterned color resist layers 108', 118', 128'. The transparent protective layer 124 is disposed on the patterned UV block layer 106'. In the embodiment, a thickness of the patterned UV block layer 106' is 0.1~2.5 microns. The display device 300 is an electrophoresis display device, and the display layer 122 is an electrophoresis display layer. The present invention is not limited herein. In other embodiments, the display device 300 can be other display device, such as a liquid crystal display device or an organic light emitting diode display device. Material of the transparent protective layer 124 can include polycarbonate or polyether imide.

In summary, in the laser transfer printing method and the display device of the present invention, there is the UV block layer disposed on the color resist layer. As such, even if the display device is used under the condition of elevated temperature or exposure to ambient light, the UV from external environment can be blocked by the UV block layer. Therefore the color of the color resist would not change, and display color of the display device would not vary. And thus the display quality of the display device can be enhanced.

The above description is given by way of example, and not limitation. Given the above disclosure, one skilled in the art could devise variations that are within the scope and spirit of the invention disclosed herein, including configurations ways of the recessed portions and materials and/or designs of the attaching structures. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A laser transfer printing method comprising:
providing a laser transfer color donor sheet having a stacked structure comprising a donor base, a light to heat conversion layer, a UV light blocking layer and a colored resist layer formed in the above mentioned order;
arranging the laser transfer color donor sheet on a display layer, the colored resist layer facing the display layer; and
providing laser light to irradiate the laser transfer color donor sheet to make the UV light blocking layer and the colored resist layer stripped to form a patterned colored resist layer and a patterned UV light blocking layer, the patterned colored resist layer and the patterned UV light blocking layer adhering on the display layer, the patterned colored resist layer located on the display layer, the patterned UV light blocking layer located on the patterned colored resist layer.

2. The laser transfer printing method as claimed in claim 1, wherein the patterned UV light blocking layer comprises a mixture of titanium dioxide and thermoplastic elastic resin.

3. The laser transfer printing method as claimed in claim 2, wherein the thermoplastic elastic resin comprises polyurethane resin or polyester resin.

4. The laser transfer printing method as claimed in claim 1, wherein the thickness of the patterned UV light blocking layer is 0.1~2.5 microns.

* * * * *